(12) United States Patent
Burke

(10) Patent No.: US 9,730,339 B2
(45) Date of Patent: Aug. 8, 2017

(54) COMMON BUS STRUCTURE FOR AVIONICS AND SATELLITES (CBSAS)

(71) Applicant: Edmund David Burke, Santa Maria, CA (US)

(72) Inventor: Edmund David Burke, Santa Maria, CA (US)

(73) Assignee: Edmund David Burke, Santa Marie, CA (US)

( * ) Notice: Subject to any disclaimer, the term of this patent is extended or adjusted under 35 U.S.C. 154(b) by 129 days.

(21) Appl. No.: 15/084,181

(22) Filed: Mar. 29, 2016

(65) Prior Publication Data

US 2016/0324019 A1    Nov. 3, 2016

Related U.S. Application Data

(63) Continuation-in-part of application No. 14/300,233, filed on Jun. 10, 2014, now abandoned.

(51) Int. Cl.
*B64G 1/66* (2006.01)
*B64G 1/40* (2006.01)
(Continued)

(52) U.S. Cl.
CPC .......... *H05K 5/0021* (2013.01); *B64D 27/00* (2013.01); *B64G 1/24* (2013.01); *B64G 1/40* (2013.01);
(Continued)

(58) Field of Classification Search
None
See application file for complete search history.

(56) References Cited

U.S. PATENT DOCUMENTS

| 3,340,439 A | * | 9/1967 | Yeager | H05K 7/023 361/735 |
| 5,415,255 A | * | 5/1995 | Hafner | A45C 7/005 190/107 |

(Continued)

*Primary Examiner* — Xanthia C Cunningham

(57) ABSTRACT

A Common Bus Structure for Avionics and Satellites (CBSAS) (10) as shown in FIG. 1 is comprised of a module lid (14), module floor (38), module stack base (16), module compression bolts (22) and stackable modules (12). Stackable modules (12) are sub-dividable to create module scaled chamber volumes (45) individually as required, while stackable modules (12) simultaneously create at least one collectively continuous raceway sealed chamber volume (44) perpendicular to individual stackable modules (12) in the vertical direction where no module floor (38) is present, in order to internally electrically interconnect the contents of any stackable module (12) with the contents of any other stackable module (12) via internal connector raceway system (24). Raceway sealed chamber volume (44) therefore collectively and continuously traverses all present stackable modules (12) positioned between module lid (14) and module stack base (16). Modules are interchangeable and interconnectable in any order, and contain all required electronic or mechanical components required for CBSAS (10) to function as a single box consolidated avionics system that is equally functional in the atmosphere or the vacuum of space, while also being fully functional as a single complete stand-alone satellite system. CBSAS (10) enables a paradigm shift in the aerospace industry whereby all legacy and current multiple black-box systems on aerospace platforms such as missiles, rockets, satellites and aircraft are extremely inefficient when compared to the size, weight and power attributes of CBSAS (10). The ability for CBSAS (10) to be instantly employable as either a single box consolidated avionics system for use within the atmosphere or in space while also being fully functional as a stand-alone satellite (Continued)

Figure 1:
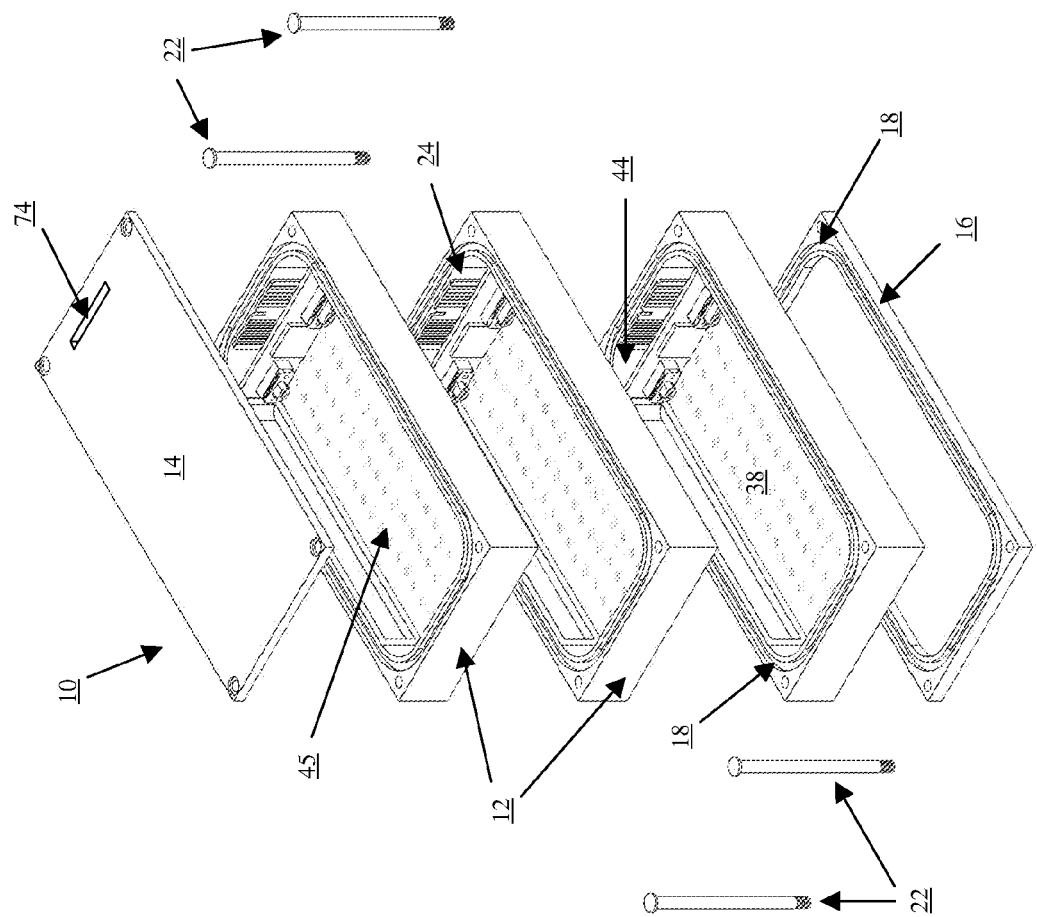

enables a hardware, firmware and software capability never before manifested in the aerospace industry.

14 Claims, 9 Drawing Sheets

(51) Int. Cl.
   *B64G 1/24* (2006.01)
   *H05K 5/00* (2006.01)
   *G05D 1/08* (2006.01)
   *B64G 1/42* (2006.01)
   *B64D 27/00* (2006.01)
   *H01Q 1/28* (2006.01)
   *H05K 9/00* (2006.01)

(52) U.S. Cl.
   CPC .............. *B64G 1/425* (2013.01); *B64G 1/66* (2013.01); *G05D 1/08* (2013.01); *H01Q 1/28* (2013.01); *H05K 9/0007* (2013.01)

(56) References Cited

U.S. PATENT DOCUMENTS

| | | | |
|---|---|---|---|
| 5,677,830 A * | 10/1997 | Nogas | H05K 7/1435 361/732 |
| 5,838,548 A * | 11/1998 | Matz | H05K 5/0021 174/50.51 |
| 6,080,003 A * | 6/2000 | Tamura | H05K 5/0021 439/347 |
| 6,201,698 B1 * | 3/2001 | Hunter | H05K 7/1435 361/704 |
| 6,698,851 B1 * | 3/2004 | Ludl | H05K 5/0021 312/108 |
| 6,999,305 B1 * | 2/2006 | Calcote | H02B 1/01 174/50 |
| 7,184,272 B1 * | 2/2007 | Harlacher | H05K 7/023 361/728 |
| 7,679,924 B2 * | 3/2010 | Davis | H05K 7/186 361/735 |
| 8,446,723 B2 * | 5/2013 | Goza | H05K 5/0021 29/592 |
| 8,665,599 B2 * | 3/2014 | Shen | H02J 7/0045 361/301.4 |
| 8,749,990 B2 * | 6/2014 | Cheng | H02M 3/00 361/601 |
| 8,929,084 B2 * | 1/2015 | Vogas | H05K 1/144 174/559 |
| 2003/0217495 A1 * | 11/2003 | Nagamine | G09F 9/00 40/605 |
| 2004/0089618 A1 * | 5/2004 | Lauchner | H05K 5/0021 211/26 |
| 2004/0127095 A1 * | 7/2004 | Derr | H05K 5/0021 439/527 |
| 2006/0285289 A1 * | 12/2006 | Jones | H05K 5/0021 361/679.31 |
| 2007/0297158 A1 * | 12/2007 | Lee | G06F 1/184 361/790 |
| 2008/0310095 A1 * | 12/2008 | Chiang | H05K 7/023 361/679.31 |
| 2009/0141458 A1 * | 6/2009 | Liu | G06F 1/185 361/728 |
| 2010/0294528 A1 * | 11/2010 | Sella | G08B 13/1409 174/50.5 |
| 2012/0020030 A1 * | 1/2012 | Merlet | H05K 7/1432 361/735 |
| 2012/0262876 A1 * | 10/2012 | Hensley | H05K 7/1487 361/690 |
| 2013/0087377 A1 * | 4/2013 | Adachi | H01R 13/648 174/372 |
| 2013/0176687 A1 * | 7/2013 | Epperson | G05B 19/0421 361/735 |
| 2013/0279121 A1 * | 10/2013 | Lin | H05K 7/06 361/737 |
| 2014/0009894 A1 * | 1/2014 | Yu | H05K 5/0021 361/735 |
| 2015/0282352 A1 * | 10/2015 | Ritter | G06F 1/1632 361/679.01 |
| 2015/0289389 A1 * | 10/2015 | Conway | B65D 21/0209 220/4.02 |
| 2016/0170453 A1 * | 6/2016 | Yamazaki | G06F 1/183 361/679.4 |
| 2016/0212865 A1 * | 7/2016 | Miyake | H02B 1/202 |
| 2016/0212884 A1 * | 7/2016 | Ruberto | H05K 5/0021 |

* cited by examiner

COMMON BUS STRUCTURE FOR AVIONICS AND SATELLITES (CBSAS)

CROSS-REFERENCE TO OTHER RELATED APPLICATIONS

This application is the formal patent submission based upon the Provisional Patent No. U.S. 61/574,812 titled, "Intelligent Modular Aerospace System" filed on 8 Aug. 2011, and is a Continuation in Part of "Intelligent Modular Aerospace System (XMAS)", application Number U.S. Ser. No. 13/507,773 filed on 25 Jul. 2012, and "Intelligent Modular Aerospace Technology System (IMATS)", application Number U.S. Ser. No. 14/300,233 filed on 14 Jun. 2014.

BACKGROUND

Prior Art

The following is a tabulation of some prior art that presently appears relevant:

| Pat No. | Issue Date | Patentee |
| --- | --- | --- |
| 4,821,914 | 1989 April | Owen, James |
| 5,314,146 | 1994 May | Chicoine, Gerald M |
| 5,375,709 | 1994 December | Petro, Alan |
| 5,534,366 | 1996 July | Hwang et al. |
| 5,755,406 | 1998 May | Ashton, Richard |
| 6,043,629 | 2003 March | Ashley et al |
| 6,242,691 | 2001 June | Reese, Kenneth |
| 7,184,272 | 2007 February | Harlacher, Mark |
| US20040089618 | | Lauchner, Craig |

Publications:
Jung Soon Jangt and Claire J Tornlint
"Design and Implementation of a Low Cost, Hierarchical and Modular Avionics Architecture for the Dragon Fly UAVs"
AIAA Paper 2002-4465.
Rene L. C. Eveleens,
"Open Systems Integrated Modular Avionics- The Real Thing"
National Aerospace Laboratory NLR, Netherlands, 2006

To date, all classes of avionics equipment have existed under a sole functional classification of 'avionics', while all satellites have existed under a separate and distinct functional classification of 'satellites'. With no commonality or crossover with design, manufacture or testing, these two distinct disciplines of avionics and satellites ironically share a common core of similar integrated functionality such as data processing, I/O, communications, GPS, IMU and a power source.

When installed on a vehicle such as an airplane, missile or rocket or satellite etc., an avionics suite consists of an array of numerous separate and distinct boxes, often supplied by a diverse number of companies. Each box is individually designed, manufactured, qualification tested for the requirements for a particular vehicle, and specifically mounted on board that vehicle in a pre-determined location, usually in the vicinity of the other avionics boxes per weight and balance considerations, and collectively occupy substantial mounting space and add significant weight.

If one desired to simply stack these separate boxes on top of each other up in a vehicle to save footprint space, it would be impossible to do so due to the individual thermal, structure and cabling requirements of each box, in addition to the diverse size of the boxes, with no common bolt pattern existing for connecting them together. Furthermore, there is no possibility for these individual boxes to be ganged together to form the structure of a consolidated avionics unit or a free-standing satellite for the reasons previously listed, which gets even more complicated if one wanted to add deployable solar panels and a propulsion/attitude control system for orienting the satellite in space.

In other words, current avionics suites and satellites along with their associated systems require a user to purchase, integrate, environmentally qualify and maintain many individual self-contained component assemblies, each employing singular independent functions, hereafter known as black-boxes for each individual required function and capability. In addition to the acreage and weight requirements demanded by these federated components, this antiquated approach makes it physically and financially impossible to implement an incremental or full upgrade of components within these individual black-boxes to meet its new and changing requirements, as these boxes are sold as a sealed single unit with a serial number that relates to exactly what is in that black-box.

Additionally, if an upgrade is required, the many black-boxes of an avionics suite or the internal workings of a satellite system forces a customer into the extremely high cost of redeveloping and environmentally qualifying each of the many separate black-boxes which comprise that avionics suite or satellite, consistently resulting in an unnecessary and extremely large cost for an even incremental or minimal upgrade switch-out to incorporate a newer black-box with a greater capability than the previous one. Similarly, each black box is typically only usable on a single class of vehicle, and if not space-qualified it cannot be used in a space application, and is therefore restricted for use within atmospheric benign conditions. Conversely, a typical space-qualified black-box would be cost prohibitive to employ on an aircraft or a vehicle only used in benign atmospheric conditions from the earth's surface on up into typical aircraft altitudes.

To the best of our knowledge, no prior art exists regarding any avionics or satellite systems which even remotely share a similar architecture, let alone an identical architecture and are instantly adaptable and employable into either application of an avionics suite for use within the atmosphere or in space, or as a satellite in a single integrated assembly exhibiting the qualities of complete modularity, scalability, flexibility, stackability, interconnectivity, adaptability, reconfigurability and interchangeability in an intelligently consolidated manner. Additionally, no federated avionics suite of functional black boxes exist which can be adapted into, and utilized in any aerospace vehicle operating in all environments from benign atmospheric to the harsh and unforgiving environment of space, without costly modifications which would make the reality of this spectrum of applications cost prohibitive, and be far outside the bounds and intention of this invention.

There are however a very limited number of inventions addressing modular systems, battery packs and modular control electronics for batteries being one of them. A modular battery pack invention by Hwang et. Al. only concerns itself with the physical mounting of interfaces for a battery's easier replacement. The modular control electronics for the battery invention of Ashley et al, only concerns itself with the modular control of charging each battery cell to protect the batteries and optimize their performance. Papers by Jung Soon Jangt/Claire J Tornlint and Rene L. C. Eveleens describe systems which while hint at a modular approach, are only partially modular and integrated while falling completely short at solving the problems inherent in combining all components such as RF (wireless communication), Power, processor, data communication and I/O, and navigation functions into a single integrated space-qualified box, and additionally have not even considered the complexities involved with passing Electromagnetic Interference (EMI)/Radio Frequency Interference (RFI) and thermal considerations inherent with a totally integrated modular system containing all functions necessary to serve in a true and complete avionics or other aerospace technology role, all in a single box. Ashton describes a modular approach to satellite bus design for larger satellites which enables a streamlined way to have a great deal of commonality with structures common between an assembly line of mixed satellites, however none of his approach even remotely hint at how his design could ever be even adapted for use as a consolidate avionics system. Reese discusses the packaging of electronic devices for operating in extreme environments including EMI with faraday cage shielding. Chicoine demonstrates the concept of a multi-mission large spacecraft bus having improved structural, thermal and accessibility characteristics. Owen has defined a low temperature storage container. Finally, the invention of Lauchner (US20040089618) in view of Harlacher (U.S. Pat. No. 7,184,272) discloses a chambered container capable of functioning as a single integrated system. However, due to the complete lack of a module to module electrical EMI/RFI isolation or filtering scheme being discussed either singly or in combination with each other of their systems, their inventions are not suitable for functioning as a single integrated system combining RF, Power, Comm and Data into a single integrated system. Without it being possible for them to singly or in combination with each other combine the functions of RF, Power, Comm and Data together into a single integrated system, their single integrated system by definition can never function in the capacity as either a self-contained avionics unit or satellite system.

Furthermore, their systems are subject to an instant system-wide failure given the simple RF leakage of any component in any of their modules, which would then instantly contaminate and corrupt all the RF signal processing occurring in all of their modules, rendering their system instantly dead and unusable. All these above deficiencies of Lauchner/Harlacher are even further compounded by their lack of EMI/RFI filtering of their incoming external power which will similarly result in contamination and corruption of all their RE signal processing in all of their modules, rendering their system instantly dead and unusable as soon as power is applied to their system.

Individually or collectively however, none of the above inventions mention or discuss a method of constructing a common bus systems that is instantly usable as a satellite or as a single box consolidated stacked avionics suite. Due to the nature of these systems, none of them can be adapted to the extent of the intent and demands that are required by this invention for the following reasons:

(a) No federated black-box avionics system or satellite incorporates a methodology for isolating/combining/reconfiguring internal components either physically or via software command in an integrated fashion in the event that mission requirements change, in addition to it being impossible to instantly adapt these federated black-boxes into a single stacked satellite structure bus.

(h) The failure of a single black-box in a federated aerospace avionics suite or satellite has the high likelihood of jeopardizing a mission resulting in a system failure, as it is not possible to automatically protect the system with work-arounds which could be automatically implemented because of the proprietary nature of each individual black-box making up the avionics suite or satellite.

(c) There is no single common system available to provide real-time monitoring/feedback of the health and status of all components within an array of avionics black-boxes or of a satellite, thus generating the need for a vast array of costly proprietary ground support equipment.

(d) The limiting architecture and design of existing federated black-box systems presently in use with avionics or satellites preclude the rapid integration of external sensors or other sources in an instant interfacing manner.

(e) No capability exists to restructure in real-time the interaction of two or more federated black-boxes within a federated avionics system, either within a satellite or avionics suite application, and certainly none exists that can be commonly utilized with both.

(f) In addition to inefficiencies that accompany the limiting factors encountered in fielding today's federated avionics or satellite systems, their 'antiquated upon delivery' nature also lends themselves to significant operations/maintenance issues and costs required to independently recondition and service components within the federated black-boxes of an avionics suite or satellite.

(g) The closed and proprietary nature of today's federated/only partially integrated modular aerospace and avionics hardware systems is firmly based upon obsolete technology with long-lead time architecture by its very nature, and is often size, weight and power (SWAP) excessive when compared to the rapidly evolving technologies which cannot be integrated and consolidated without major redesign and a prohibitive cost.

(h) Present avionics suites and satellites are limited to their individual unique manufacture, and do not allow for their rapid reconfiguration to a larger/smaller capacity, either physically or electronically.

(i) All present avionics systems negate the possibility of morphing their configuration into a modular and consolidated arrangement, thus increasing their design, implementation and qualification costs.

(j) Extreme launch environments cause present avionics systems with multiple black-boxes to undergo costly individualized pre-qualification testing to mitigate potential problems from surfacing during the operational employment of their fully fractionalized system.

(k) Present federated avionics system architectures do not allow for a method of control aside from the immediate systems they are employed within, thus eliminating the possibility of mesh network control if in use with a satellite, and also preclude redundant fail-over switching and fault tolerance.

(l) Currently deployed federated avionics systems are incapable of providing integrated predictive and real-time monitoring of health and status, thus precluding the capability to head-off and work-around an internal failure before it happens.

(m) Federated avionics systems with multiple black boxes as currently arranged in aerospace systems are not capable of being quickly combined with other system hardware in real-time in the event of a change in mission requirements or a change in external interfaces.

(n) No fail-over/safe and fault tolerance capability exists to insure functionality of the overall system if a single component fails within a federated black box avionics system or satellite.

(o) Space rated environmental qualification testing is complex and plagues all multiple black-box designs, forcing the designer into expensive qualification re-testing programs that have major schedule and cost impacts even if a tiny component and/or subsystem within a black-box is removed, changed or modified.

(p) Today's federated avionics systems comprised of multiple black boxes cannot accommodate the capability for a collective and integrated predictive tool to be implemented with all boxes due to a lack of their standardized mechanical and electrical interfaces.

(q) Impacts of size and weight constantly arise during employment of existing multiple black-box systems, often resulting in the sacrifice of other mission capabilities.

(r) Simultaneous conditioning, reconfiguring, query, reset, work-around and initializing on a collective basis is not possible with a federated black-box system.

(s) Current avionics and satellite systems cannot and do not combine processor, data communication and I/O, RF (wireless communication) and power devices in one single nonfederated system that can pass rigorous environmental (thermal, random and sine vibration, shock, etc.) and EMI/RFI testing.

(t) Present avionics systems are separately designed/built for two separate and distinct realms of operation, that of being used within the benign atmospheric conditions or the harsh environment of space, while none can accommodate both environments in a practical and cost-effective way.

(u) The federated black-box avionics systems of today cannot be integrated into a single unit for passing space qualification testing.

(v) All existing and not even yet fielded modular systems described in the above prior art are not able to accommodate RF devices internally in the vicinity of a power system without extensive additional shielding, and are thus not completely open, modular, scalable, and reconfigurable, and thereby do not approximate the intent or capabilities of this invention.

(w) No proposed modular systems of the prior art incorporate individual EMI chamber modules that interlock for simultaneously creating at least two instant faraday cages, and while being a shock/vibration immune enclosure that is expandable.

(x) All federated black-box avionics systems employ an interconnection system that is external to the individual black-boxes, and thus manifest a definite and inherent weakness that cannot be surmounted if full space qualification testing is desired.

(y) Current federated black-box avionics systems cannot be employed for use on different aircraft or satellites without re-engineering for the particulars related to the locations, power and mounting surfaces in the new vehicle.

(z) Federated black-box avionics systems in space are vulnerable to external physical attack due to their large size that results from the overall additive sizes of their individual black-boxes.

SUMMARY

The summation of all these lacking capabilities serve to indicate why no prior art regarding an Common Bus Structure for Avionics and Satellites exists, and more specifically such art would require the qualities of complete modularity, scalability, flexibility, stackability, interconnectivity, adaptability, reconfigurability and interchangeability in a singular integrated unit to form an intelligent consolidated architecture incorporating the features of RF (wireless communication), processor, data communication and I/O, EMI/RFI and power which can instantly function within benign atmospheric conditions, and up through the atmosphere into the vacuum and intense temperature extremes of space, as well as the high shock and vibration environment of missile/rocket transit in-between. As such, without the advancements and innovations detailed in this invention, the aerospace industry will be forever relegated to the same 'black box syndrome' where the individual federated avionics and satellite systems with multiple black-boxes are costly and vehicle specific when used within/without the atmosphere, take up unnecessary space and weight with a costly price tag, and never be instantly employable for use as either a consolidated avionics unit on/within any aerospace platform such as missiles, rockets, airplanes, UAV's and satellites, or the structure itself serving as a self-contained satellite comprised of the bus forming the complete structure of the satellite.

Additionally, the methods proposed by Jung Soon Jangt/Claire J Tornlint and Rene Eveleens actually do nothing to advance the art whereby they left out the most important and to this day unsolvable methods of integrating RF (wireless communication) functions with power, processor, I/O, EMI and RFI isolation into a single unit which can be instantly used within or outside the atmosphere without any modification and instantly pass space qualification testing as a single consolidated unit for operating in any environmental regime in the role as either an avionics system or as a stand-alone satellite.

ADVANTAGES

Accordingly, the objects and advantages of this invention are to incorporate all attributes necessary to instantly manifest a Common Bus Structure for Avionics and Satellites which can be used for avionics on any platform such as an aircraft, UAV etc. within the atmosphere, or in space on a large satellite desiring to upgrade its internal avionics by removing its black-boxes to save size and weight, or even as a stand-alone satellite which demonstrates the qualities of modularity, scalability, flexibility, stackability, interconnectivity, adaptability, reconfigurability, consolidation and interchangeability in a single unit combining the functions of RF (wireless communication), processor, data communication and I/O, EMI/RFI isolation (radiative and conductive emissions), and power which can instantly function within benign atmospheric conditions, and up through the atmosphere into the vacuum and intense temperature extremes of space, as well as survive the high shock and vibration environment of missile/rocket transit in-between these locations.

Additionally, employing the approach detailed by this invention will allow for a rapid revolution to occur in the avionics and satellite industries to instantly benefit existing aerospace platforms such as missiles, rockets, aircraft and UAV's. In addition to the clear advantages we have defined as CBSAS, this invention also benefits from the following important advantages:

(a) A complete and comprehensive intelligent capability is integral to the CBSAS that isolates, combines, and reconfigures internal components in any module and in concert with the functions in all associated modules in the event of an internal system failure or real-time mission change.

(b) The ability to provide backup, fail-over and fault tolerant modes between stackable and reconfigurable modules due to their non-proprietary individual nature and interconnectedness allows for a reliability standard never before achieved before in any avionics or satellite systems.

(c) The employment of a real-time monitoring and feedback methodology exists between all interconnected modules which together act as a single unit and thereby insure that all systems are performing as expected through all mission phases.

(d) The single integrated and consolidated box approach of CBSAS allows for instant communication access between any internal and/or external sources or sensors that are required to interface with any particular component or system within the CBSAS bus structure.

(e) Physical and electrical restructuring in real-time is possible within CBSAS down to any subsystem, whether within a module or as a complete module which is instantly replaceable with another module.

(f) The complete open, modular, scalable and reconfigurable architecture allows for new state-of-the-art components to be substituted and installed within the defined system at any time, insuring a customer will always have the ability to implement the latest technological capability as it is fielded, and to have the option to upgrade at any time, thus making possible the greatest capability at the lowest price with the greatest life-cycle cost efficiency.

(g) The smartly integrated commercial off-the-shelf components are of the most recent manufacture and Leading-edge capability imposing the most minimum size, weight, and power footprint of any components possible on the market today.

(h) The completely flexible architecture enables immediate physical or electronic testing at any time using a single suite of test equipment, allowing the lowest possible cost, while allowing for scaling up or down of the number of modules without impacting the amount of test equipment which is required.

(i) The instantaneous connection capability both electronically or mechanically between modules allows for an immediate modular arrangement or rearrangement at any time, and gives the ultimate flexibility to a customer who needs to keep design, implementation, and qualification costs to an absolute minimum while gaining the most comprehensive capability possible.

(j) The demonstratable capability evident in employing one CBSAS box to do the job of many black-boxes has far reaching scales of economy in weight reduction, qualification testing, troubleshooting, fielding and life cycle cost.

(k) Interconnection and communications flexibility allow for monitoring or control from any location in any configuration, including any networking capabilities wishing to be exercised or employed on an operational basis.

(l) Fail-over and fault tolerant scenarios are integral to the internal system CBSAS system workings, and can circumvent a possible failure from actually happening while status is being observed from an external viewpoint.

(m) Whenever any external events may trigger a change in flight planning or deployment, the system quickly and efficiently is capable of instantly adopting all new requirements and manifesting them into a newly defined set of parameters resulting in a redefined system in real-time which is capable of meeting all newly defined mission criteria and needs.

(n) The redundancy inherent in the CBSAS system ensures that practically no single failure can occur which would result in the loss of a mission.

(o) The simplified single box approach of CBSAS allows for the single most efficient way to conduct any and all qualification/re-qualification testing at any level from a component piece through a completely integrated and consolidated single box system, independent and irrelevant of any new components that may or may have not become a new part of the newly defined system.

(p) The historical testing and fielding of CBSAS has a large reliability database substantiating all components and their respective placements within the defined borders of the system at all levels, while absolutely minimizing the complexities involved of introducing new components.

(q) Impressive amounts of expensive vehicle real estate and payload space suddenly become available when employing the single box approach of CBSAS, allowing for notable system performance increases and accommodation of new payload capabilities while offering notable increased ease of system-wide employment.

(r) Complete access to all CBSAS box functions are available via a direct data/telemetry monitoring capability on the ground or as the vehicle is in flight, thus giving increased confidence in all aspects of mission performance, while allowing for complete control or monitoring at any desired timeframe.

(s) This single-box approach of CBSAS combines all computational processing, RF, communications and power into one modular and reconfigurable stackable system enabling the unit to undergo all environmental testing and flight certifications in a streamlined and expeditious way.

(t) The CBSAS can equally operate in benign atmosphere conditions or the vacuum of space without any modification, while being very inexpensively suited to both locations equally and instantly.

(u) The integrated nature of the CBSAS is such that it undergoes only one Space Qualification trial as an integrated unit, as opposed to multiple black box systems which must undergo Space Qualification testing on each and every black-box, with ripple effects often occurring when one black-box is replaced with another black-box, in turn mandating that other black-boxes often be replaced and re-qualified, if even slight modifications were made to interface with the changed capabilities of the original black-box that was replaced.

(v) The essence of CBSAS is that it is completely designed for full functionality in the most severe EMI/RFI environment, incorporating RF transmitting and receiving devices internally with processor, data communication and two and power in a single integrated box, and as such is the first truly integrated modular aerospace system, containing all necessary components for a complete avionics suite for use within the atmosphere or in space, or as a stand-alone satellite application.

(w) The revolutionary design of CBSAS using the tongue in groove system for interlocking the modules to share the confined space of two structures by forming one, is repeatable without any limit or modification, thereby creating a structure that is completely shock and vibration tolerant, in addition to manifesting a minimum of two instant faraday cages when two modules are assembled together in combination with a top lid and a stacking base.

(x) The internal interconnecting raceway between modules allows the outer surface of CBSAS to remain wire-free, while simultaneously shielding all wires within an internal raceway faraday cage to further allow for the simplest passage of space qualification testing.

(y) CBSAS can be equally utilized within benign atmospheric conditions on any vehicle, terrestrial or not, or the extreme environment of space without any modification, thus allowing for simple low-cost applications to leverage the robust nature of the truly integrated modular approach while achieving the same level of functionality it would cost orders of magnitude more if attempted with existing individual black-boxes, which in the final analysis could not be adapted.

(z) The applicability of the CBSAS open, modular and reconfigurable approach allows for it to be used as a stand-alone avionics system for placement within a larger satellite structure, or serve as an actual satellite itself which is as robust as any large satellite equivalent, allowing for these smaller undetectable satellites to proliferate space while being much more survivable and resilient than a larger satellite due to their small and easily replenishable nature, and when networked together in space, emulate the capabilities of a large satellite.

DRAWINGS

Figures

FIG. 1. is a three dimensional drawing exploded view which illustrates the main exterior and interior surfaces of the CBSAS modules which can be of varying height, along with its internal connector raceway system and lid/base and bolt-down methodology which secures the entire assembly together.

Figure 2:
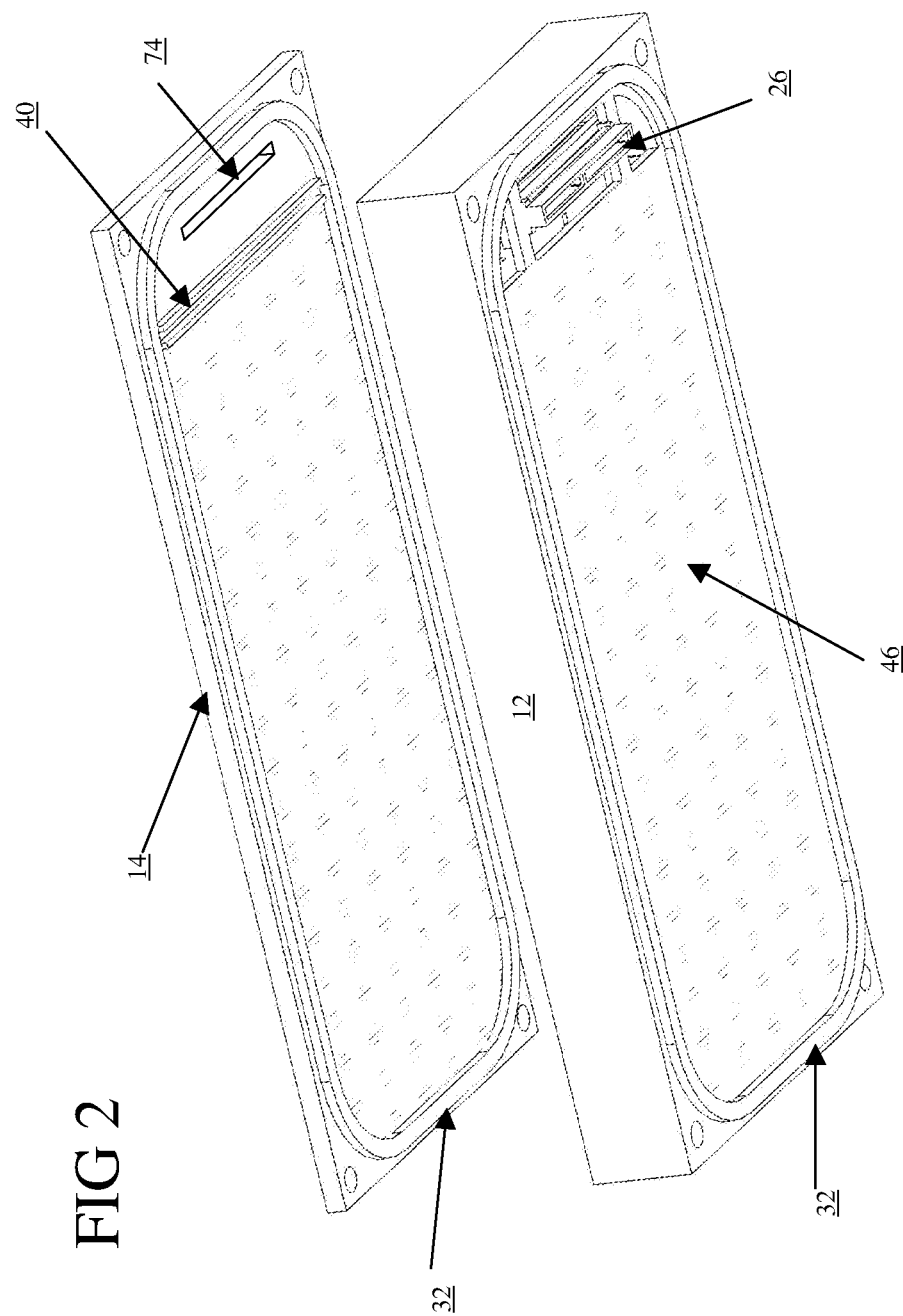

FIG. 2. is a three dimensional drawing showing the underside of a lid and a typical CBSAS module, along with a view of the underside of an internal connector raceway system.

Figure 3:
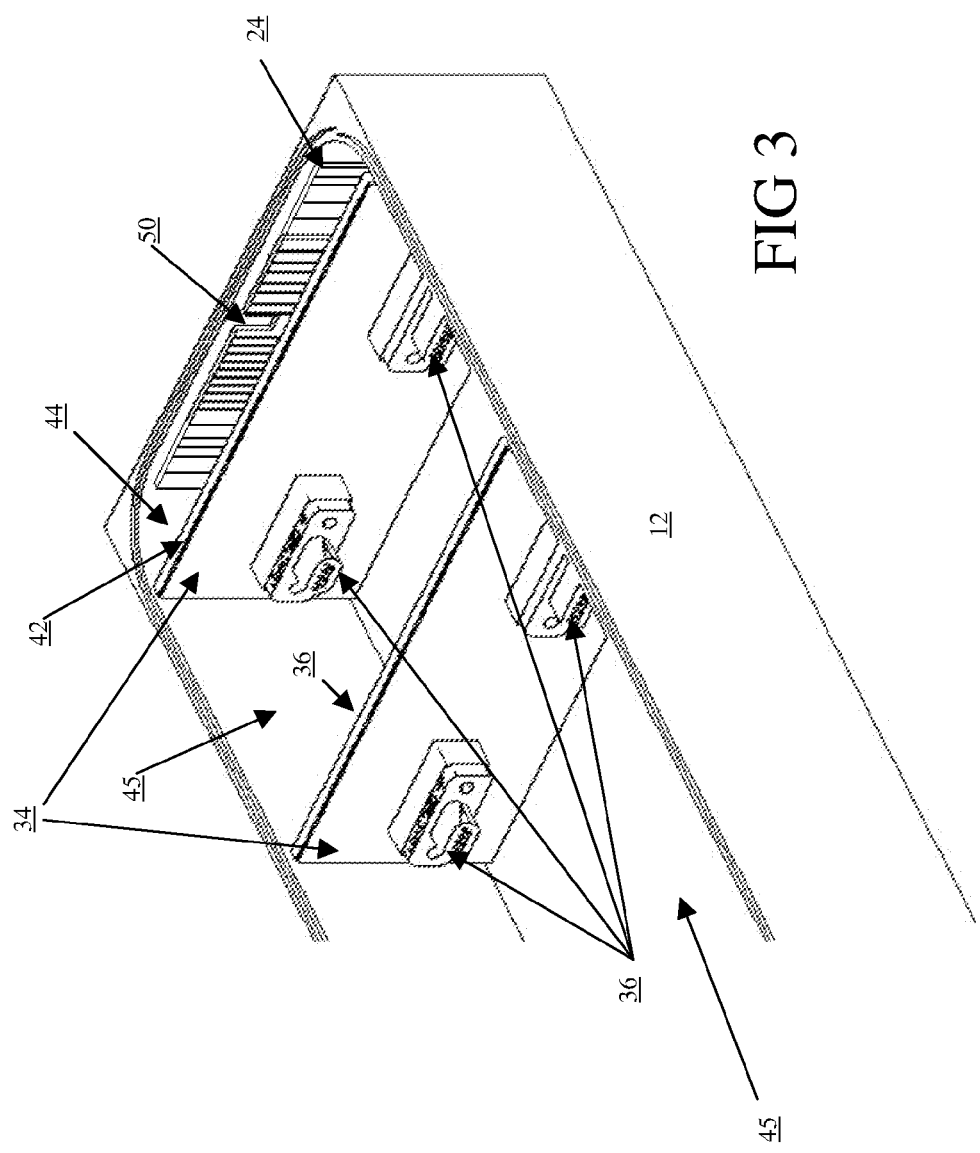

FIG. 3. is a three dimensional close-up top view of the internal connector raceway system as it sits within a module while illustrating sub-dividing walls within the same module.

Figure 4:
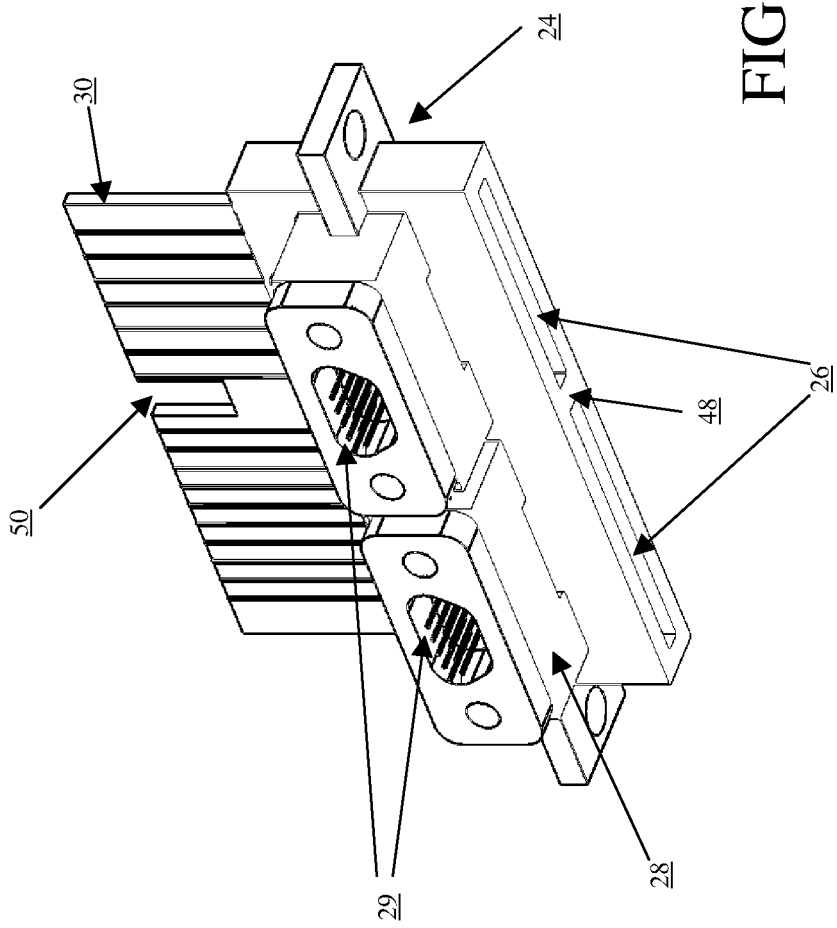

FIG. 4. is a three dimensional close-up view of an internal connector raceway system which is shown installed in FIGS. 1, 2 and 3.

Figure 5:
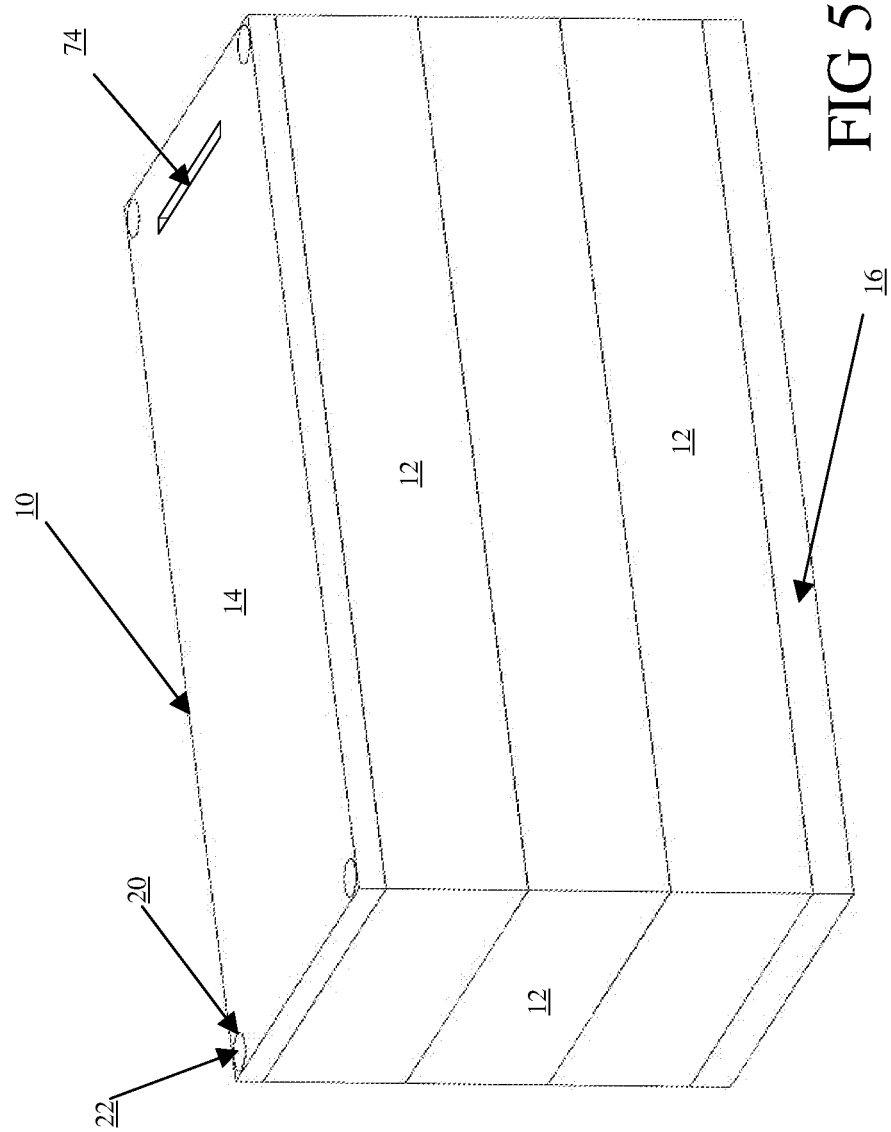

FIG. 5. is a three dimensional bolted together example of an assembled CBSAS.

Figure 6:
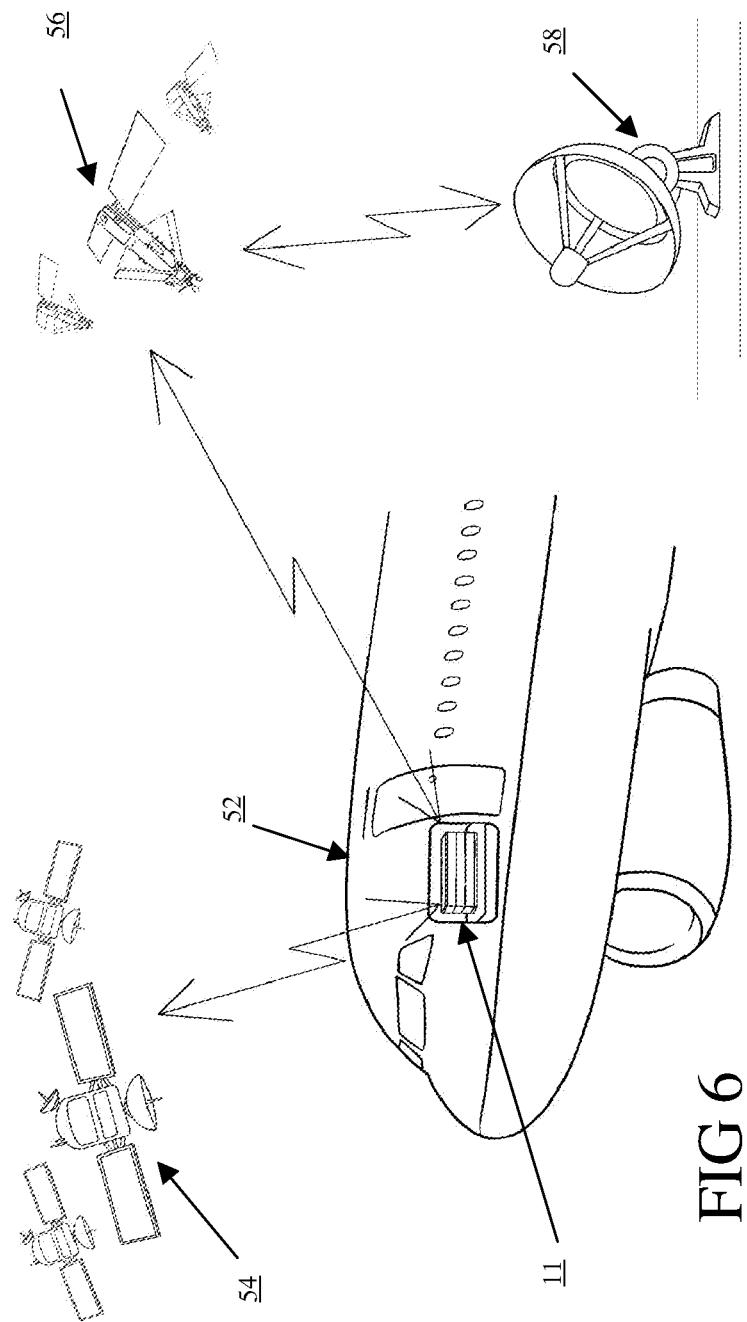

FIG. 6. is a three dimensional view of the assembled CBSAS box of FIG. 5 deployed as avionics in a typical representative aircraft, which could also be an unmanned vehicle.

Figure 7:
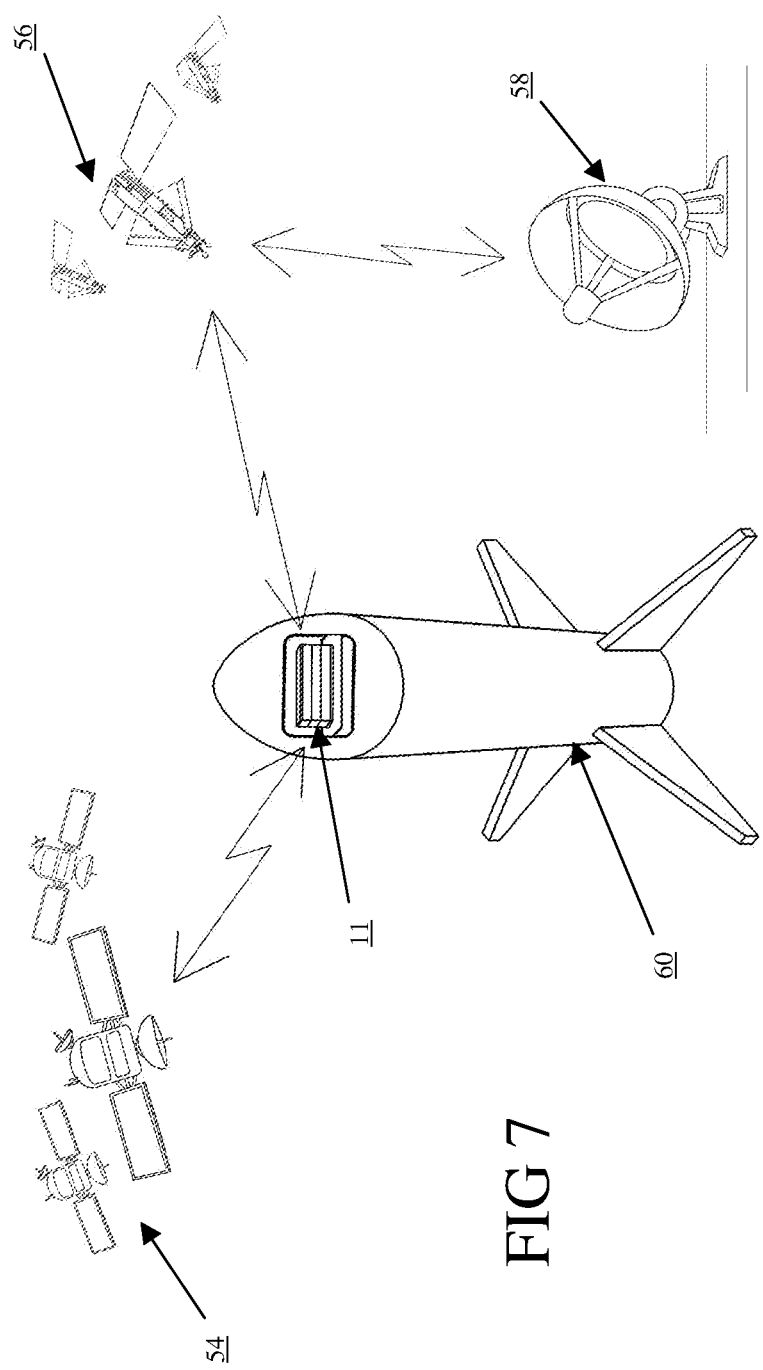

FIG. 7. is a three dimensional view of the assembled CBSAS box of FIG. 5 deployed as avionics in a typical representative missile or rocket.

Figure 8:
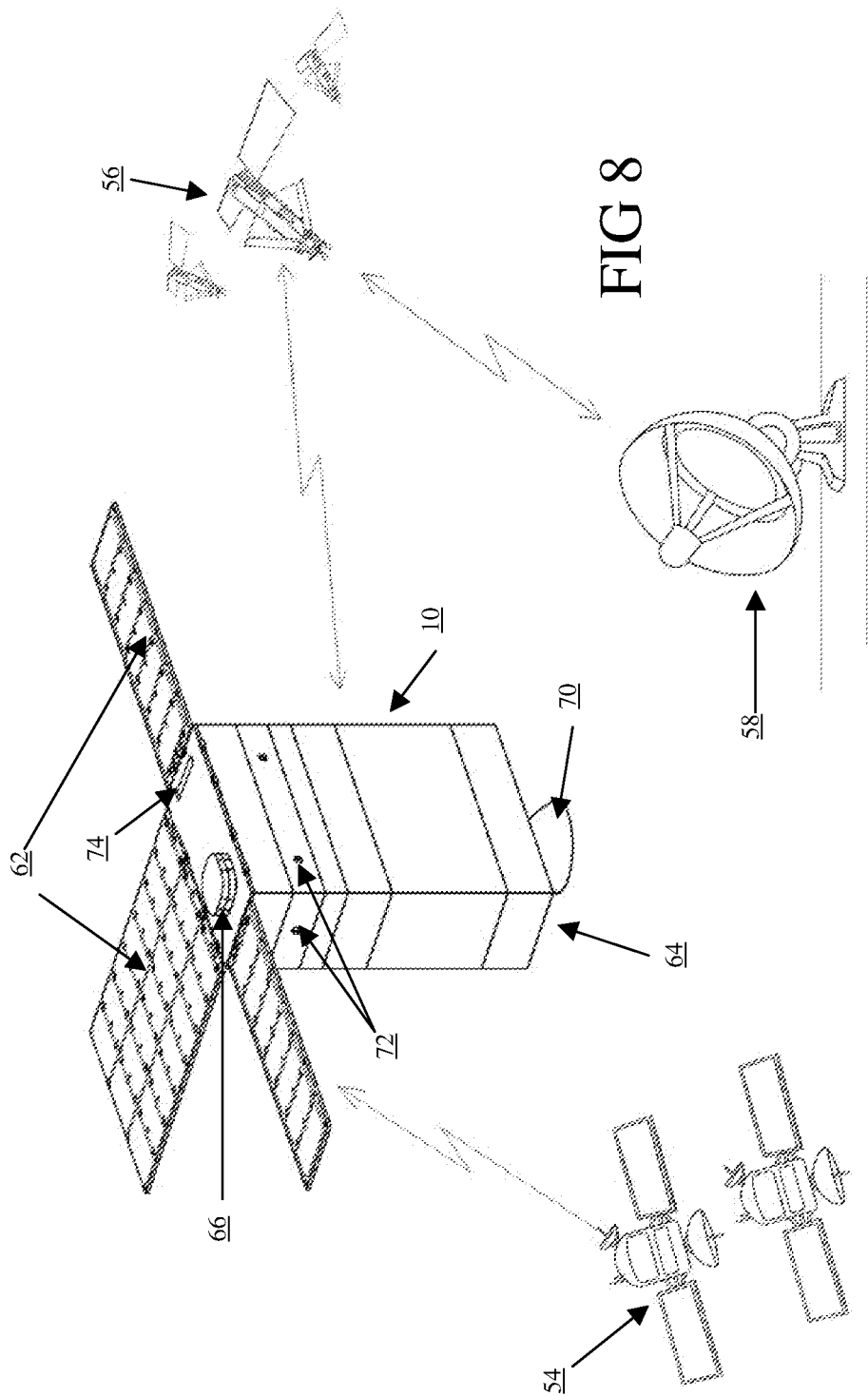

FIG. 8. is three dimensional representative view of the CBSAS box of FIG. 5 with modules of different heights, and the entire unit employed as a fully functional stand-alone satellite with solar panels deployed.

Figure 9:
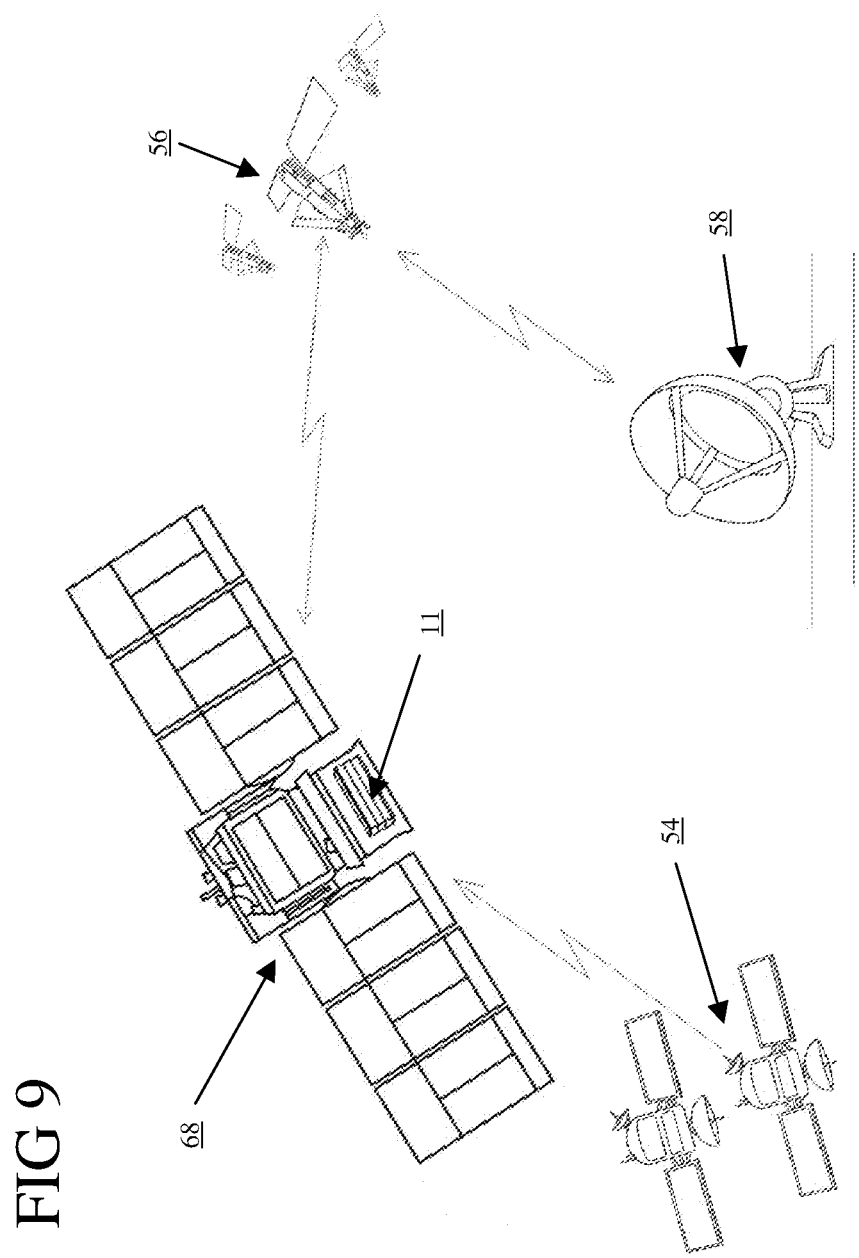

FIG. 9. is a three dimensional view of the assembled CBSAS box of FIG. 5 deployed as avionics within a typical representative large satellite.

REFERENCE NUMERALS 10 common bus structure for avionics and satellites
11 stand-alone consolidated avionics system
12 stackable module
14 module lid
16 module stack base
18 module base female sealing groove
20 module compression bolt hole
22 module compression bolt
24 internal connector raceway system
26 internal raceway female connection
28 raceway wall connection interface
29 subdividing wall connector female interface
30 internal raceway male connection
32 module sealing tongue
34 module partitioning wall
36 representative subdividing wall connector
38 module floor
40 wall female sealing groove
42 wall male sealing tongue
44 raceway sealed chamber volume
45 module sealed chamber volume
46 module floor underside
48 internal raceway male connection guide
50 internal raceway female connection guide
52 representative aircraft platform
54 GPS satellite constellation
56 generic relay satellite constellation
58 standard telemetry ground receiving system
60 representative missile/rocket platform
62 representative solar panels
64 stand-alone complete satellite system
66 representative antenna
68 representative satellite platform
70 representative thrusting propulsion system
72 representative attitude control thrusting system
74 representative power/battery charging connector/cabled communication/monitoring interface

DETAILED DESCRIPTION

FIGS. 1-9

An common bus structure for avionics and satellites 10 as illustrated in FIGS. 1-5 is comprised of any number of stackable modules 12 of same or varying heights, electrically interconnected via an internal connector raceway system 24 within raceway sealed chamber volume 44 and physically via module sealing tongue 32 and module base female sealing groove 18 and wall female sealing groove 40 and wall male sealing tongue 42 in addition to module compression bolt holes 20 and module compression bolts 22 forming a complete integrated and sealed common bus structure for avionics and satellites as illustrated in FIG. 5 where module lid 14 interfaces with the top of stackable module 12 and beneath stackable module 12 with module stack base 16 by utilizing the same module sealing tongue 32 and module base female sealing groove 18 as occurs between any stackable module 12. When a stackable module 12 is secured on top of another stackable module 12, module floor underside 46 seals the top of another module 12 in the exact manner that module lid 14 does, forming a sub-dividable module sealed chamber volume 45, while simultaneously if two stackable modules 12 are connected, internal connector raceway system 24 connects to another internal connector raceway system 24 via inserting internal raceway male connection guide 48 into internal raceway female connection guide 50 in conjunction with securely fitting internal raceway male connection 30 into internal raceway female connection 26.

In FIG. 1, internal to module 12 is module floor 38 forming a sealed chamber when either another module 12 is secured above it, or a module lid 14 is secured above it. All electrical connections into a raceway sealed chamber volume 44 are via a representative subdividing wall connector 36 electrically interfacing with subdividing wall connector female interface 29 integral to raceway wall connection interface 28 via a back-to-back representative subdividing wall connector 36 facing directly opposite to representative subdividing wall connector 36 as frontally shown in FIG. 3. A representative second module partitioning wall 34 is also shown inside stackable module 12 in FIG. 3. A stackable module 12 can be internally subdivided any number of times via placement of an additional module partitioning wall 34 at any predetermined location within stackable module 12.

A common bus structure for avionics and satellites 10 as illustrated in FIG. 5 shows its versatility in FIG. 6 with instant unmodified placement as a stand-alone consolidated avionics system 11 aboard a representative aircraft platform 52 which has direct communication paths to GPS satellite constellation 54, generic relay satellite constellation 56, and standard telemetry ground receiving system 58.

A common bus structure for avionics and satellites 10 as illustrated in FIG. 5 shows its versatility in FIG. 7 with instant unmodified placement as a stand-alone consolidated avionics system 11 aboard a representative missile/rocket platform 60 which has direct communication paths to GPS satellite constellation 54, generic relay satellite constellation 56, and standard telemetry ground receiving system 58.

A common bus structure for avionics and satellites 10 as illustrated in FIG. 5 is instantly adaptable into becoming stand-alone complete satellite system 64 as shown in FIG. 8, with the addition of representative solar panels 62, a representative thrusting propulsion system 70, a representative attitude control thrusting system 72 and a representative antenna 66, all accommodated and integral to a common stackable module 12.

A common bus structure for avionics and satellites 10 as illustrated in FIG. 5 shows its versatility in FIG. 9 with instant unmodified placement as a stand-alone consolidated avionics system 11 aboard a representative satellite platform 68 which has direct communication paths to GPS satellite constellation 54, generic relay satellite constellation 56, and standard telemetry ground receiving system 58.

A common bus structure for avionics and satellites 10 as illustrated in FIGS. 1, 2, 5 and 8 specifically detailing representative power/battery charging connector/cabled communication/monitoring interface 74 being an interface access point for monitoring/controlling an array of electronic component internals of CBSAS by externally cabling in power for charging on-board batteries and for cabled bi-directional communication with all systems within common bus structure for avionics and satellites 10.

OPERATION—FIGS. 1-9

The common bus structure for avionics and satellites 10 as illustrated fully in FIGS. 1 AND 5, and incrementally in FIGS. 2, 3, 4 has solved the design and operational complexities involved with finally manifesting a single box which is the mainstay and common backbone of an avionics or satellite system capable of operating equally and as efficiently within benign atmospheric conditions as it does in the harsh environment of space, including the transit into space aboard any missile or rocket. This then being the first ever manifestation of a truly modular, stackable, scalable, flexible, inter-connectable, adaptable, reconfigurable, consolidated and interchangeable system combining the functions of RF (wireless communication), processor, data communication and I/O, EMI/RFI, power with a EMI/RFI chamber design along with the integration of complex interchangeable hardware, software and firmware into a single unit which allows for the never-before combined functions such as Time/Space/Position Information (TSPI), Data Acquisition/Processing/Relay (DA/P/R), wireless communication, avionics, navigation, command and data handling and Power Generation/Distribution (PG/D) to be contained in a single consolidated structure. Additionally, the combining of all these functions to comprise the common bus structure for avionics and satellites 10 allows for unprecedented efficiencies in design, manufacture and space qualification testing to occur on a one-box system level, and provides for all components and capabilities within stackable modules 12 to be instantly accessible for any reason by simply removing module compression bolts 22 from modular bolt holes 20, and subsequently easily separating any stackable module 12 from another stackable module 12, including module lid 14, modular stack base 16 that forms a parallel secondary floor to module floor 38, and simultaneously separates internal raceway female connection 26 from internal raceway male connection 30, along with internal raceway male connection guide 48 from internal raceway female connection guide 50, or removing module lid 14 from the top of a stackable module 12 if it is the top module stackable module 12. Stackable module 12 can be of varying height as shown in FIG. 8, depending upon the needs of the user, with internal connector raceway system 24 being variable to any measurement required to support any varied stackable module 12 height. Any components with functions such as RF (wireless communication), processor, data communication and I/O, EMI/RFI, power, navigation sources (GPS receiver, INS, IMU, etc.) can be placed in any module, and instantly interfaces with standard communication protocols through module subdividing wall connectors 36 into subdividing wall connector female interface 29 that is integral with raceway wall connection interface 28.

The innovations at the heart of the common bus structure for avionics and satellites 10 make obsolete the need to employ many distributed/federated black boxes which today results in a huge price tag for development, unnecessary size and weight implications, qualification testing of many blackboxes instead of just one, and the present need in all Black-box systems to always have RF, processor and power devices separated. Each stackable module 12 is the equivalent of one black-box which would only provide one function of the array necessary in an aerospace hardware suite, those functions, amongst others are RF (wireless communication), processor, data communication and I/O, EMI/RFI, power, and other navigation sources (GPS receiver, INS, IMU, etc.) input. By combining all these functions individually, each into a stackable module 12, one quickly and simply achieves the first truly modular, stackable, scalable, flexible, inter-connectable, adaptable, reconfigurable, consolidated and interchangeable single box that does all functions necessary in an aerospace hardware suite, while not restricting its use to being only of avionics, but also includes but is not limited to any TSPI, DA/P/R, wireless communication, navigation, command and data handling, PG/D function or even as a stand-alone satellite which can be networked in space with an unlimited number of other similar or different satellites and ground stations. The EMI/RFI chambers that instantly manifested as a module sealed chamber volume 45 and raceway sealed chamber volume 44 upon mating two stackable modules 12 or a single stackable module 12 with a module lid 14 and a module stack base 16 allow for the first time mixing of RF (wireless communication), processor, data communication and I/O, EMI/RFI, power, GPS Rx/INS/IMU navigation input in one singly space qualified box which can be used instantly on a vehicle operating in benign atmospheric conditions up through and including the harsh environment of space, and without any increase in cost due to the innovative design which is applicable and cross-cutting for use in all environments on practically any aerospace or other vehicle type. The tongue in groove design exemplified and applied with module sealing tongue 32, module base female sealing groove 18, module floor underside 46, wall male sealing tongue 42 and wall female sealing groove 40, all in combination with module partitioning walls 34 with their associated back-to-back subdividing wall connectors 36, and internal connector raceway system 24 cumulatively create the raceway sealed chamber volume 44 and subsequent individual stacked EMI/RFI chambers necessary to co-locate and mix for the first time RF, processor, data communication and I/O, EMI/RFI, power, GPS Rx/INS/EMU navigation input in one singly space qualified box which can be used instantly on a vehicle operating in benign atmospheric conditions up through and including the harsh environment of space, and without any increase in cost in any environment due to the innovative design which is applicable and cross-cutting for on practically any aerospace or other vehicle type. Additionally, external power and cabled communication are interfaced with common bus structure for avionics and satellites 10 via representative power/battery charging connector/cabled communication/min interface 74 as illustrated in FIGS. 1, 2, 5 and 8.

FIGS. 6, 7 and 9 clearly show how simple it is to use a common bus structure for avionics and satellites 10 as a stand-alone consolidated avionics system 11 on a representative aircraft platform 52 in FIG. 6, as a stand-alone consolidated avionics system 11 on a representative missile/rocket platform 60 in FIG. 7, and as a stand-alone consolidated avionics system 11 on a representative satellite platform 68 in FIG. 9. FIG. 8 illustrates how a common bus structure for avionics and satellites 10 is manifested as a completely stand-alone satellite system 64 appended with representative solar panels 62, a representative thrusting propulsion system 70 appended to module stack base 16, an appended representative antenna 66, and a representative attitude control thrusting system 72 appended to a stackable module 12, clearly creating a completely modular stand-alone military class robust satellite capability with core bus commonality to a stand-alone consolidated avionics system 11, employable on any aerospace platform as shown in FIGS. 6, 7 and 9. In the aircraft application as shown in FIG. 6, the missile/rocket application of FIG. 7, the stand alone satellite application of FIG. 8, and the larger satellite avionics application within representative satellite platform 68 as depicted in FIG. 9, the same GPS satellite constellation 54 is employed as is the same generic relay satellite constellation 56 and the same standard telemetry ground receiving system 58. The use of the architecture described in the common bus structure for avionics and satellites 10 when applied to a stand-alone complete satellite system 64 will dominate and change the satellite industry by providing the capability to build satellites which are at least as, or more robust as the currently employed individual designed ones which cost orders of magnitude more to design and develop due to their proprietary nature, and are not nearly as efficient to integrate and deploy in a responsive manner due to their unique individualistic black-box designs integrated on a case-by-case basis.

The use of the architecture described in the common bus structure for avionics and satellites 10 when applied to a stand-alone consolidated avionics system 11 will dominate and change the satellite industry by providing the capability to build consolidated avionics systems which are at least as, or more robust as the currently employed ones which cost orders of magnitude more to design and develop due to their proprietary and federated nature, and are not nearly as efficient to integrate and deploy in a responsive manner in comparison to stand-alone complete satellite system 64 due to their unique individualistic black-box designs integrated on a case-by-case basis.

ADVANTAGES

The above description distills the essence of the invention into the key component and integrated capabilities which illustrate the unprecedented aspect of this invention being the first time an avionics bus structure is usable on any aerospace platform whether employed within the atmosphere or in space, and can be equally and easily used as a standalone satellite. The qualities of complete modularity, scalability, flexibility, stackability, interconnectivity, adaptability, reconfigurability and interchangeability of an intelligent consolidated architecture into a single consolidated structure and function for multiple applications easily and elegantly takes the place of many federated black-boxes while combining functions never contemplated to combine before into one single box structure, and is capable of operating in a space or earth environment instantly without any modification, with more detailed qualities and capabilities being further described as follows:

1) Commonality of manufacture and integration by a single entity into a single consolidated structure enables the establishment of all functions and interfaces to be controlled or quickly worked-around by that single entity, which leads to unprecedented internal flexibility of capabilities which can be reconfigured and controlled if hardware changes are necessary, in addition to rapid workarounds that may be required in the event of an unplanned failure within a module.

2) The simplicity and elegance of CBSAS allows for reliability to be maintained and monitored simultaneously between all modules via integrated tests that can be automated or controlled via ground software.

3) Similarly to tests while on the ground, CBSAS has the integrated capability to do self or ground controlled integrated testing while in flight or on-orbit, and subsequently transmit that integrated data down to earth or any other monitoring location via a telemetry stream.

4) Single or multiple inputs ingested into the CBSAS from external sources are processed and distributed throughout the consolidated structure via the most efficient high-speed electronic routing in order for the system to respond in the most efficient actionable manner possible.

5) Operational readiness is easy maintained by replacing electrical or mechanical components within a module at any desired time, as well as simply removing a module and replacing it with another module with similar internal components to accomplish the same function as previously required.

6) Upgrading a single module's components, or any number of module components simultaneously is easily accomplished within the responsibility of a single integrator at a single location, who can effectively accomplish a minimal cost upgrade to the entire system, vs. the extremely expensive approach for individually upgrading numerous black-boxes, not to mention the extended timeline and coordination that would be required from numerous individual suppliers.

7) The open architecture and commonality of this system for an avionics or satellite application drives the use of the lightest and most state-of-the-art components to be employed within the modules, whether the upgrade is as simple as replacing an internal component, or if a more rapid scenario is desired, a separate substitute module can be prepared independent of the existing module desired to be replaced, and then replaced into the consolidated stack of modules on a timeline that best suits the integrator.

8) A single suite of common test equipment is employed on the consolidated stack of modules, whether it is configured as an avionics bus or a satellite, and whether or not modules are divided into two or more chambers.

9) The completely independent arrangement of modules in a consolidated stack allows for a customer to configure it in any order for any reason, especially if an Attitude Control System (ACS) with thrust ports are desired to be appended to a module comprising a stand-alone satellite configuration, whereby the most momentum leverage would be achieved by mounting the ACS towards the top of the consolidated stack.

10) The size, weight and power reductions enabled by use of CBSAS as an avionics unit or as a satellite are unparalleled in the avionics or satellite industries, and frees up acreage and weight that can be better utilized for other equipment and/or payload space, or in the case of a small satellite, the space and weight parameters freed up can be utilized for carrying more sensors or other specialized payload packages.

11) The internal raceway contained in both the avionics and satellite manifestations of CBSAS enable high-speed secure communications throughout the entire stack of modules, irrespective of the order in which they are stacked, and allows for a communications port to interface with any standard communications network.

12) The direct interconnectivity of all systems contained in all the modules insure the most robust backup capability possible whether as a standalone avionics unit or as a standalone satellite, complete with internal diagnostics that give deep insight into the status of an individual module at anytime and at any place.

13) Whether in use as a satellite or an avionics unit, CBSAS has the capability to ingest external commands from an off-board location to adjust or even completely change the previously programmed flight parameters it was initially instructed to carry out.

14) The system architecture of CBSAS allows it to internally accommodate the most tiny and powerful state-of-the-art components, allowing for redundant and fault tolerant systems to be integral with the primary ones with very little increased weight.

15) A satellite or avionics configuration in its stacked and consolidated arrangement can be environmentally qualification tested as a whole unit, thus saving many times over what environmentally qualifying the equivalent number of individual black-boxes would be.

16) All components contained or planned to be upgraded within a satellite or avionics manifestation of CBSAS have been meticulously pre-selected, along with having a full reliability assessment compliment each component, which in-turn allows for extremely high initial system reliability.

17) In addition to the size, weight and power reductions made possible by deployment of CBSAS, which in-turn leads to greater customer earning power, other huge benefits become apparent when one sees the design and manufacturing simplicity that accompanies the consolidated modular approach, allowing for rapid production to simultaneously benefit the satellite and avionics industry.

18) The simplicity inherent in the CBSAS design allows for either a satellite in orbit or an avionics package in flight to have full duplex communications with the unit, while simultaneously having continual telemetry reporting of the health and status of all systems throughout all mission phases.

19) In sharp contrast to a federated black-box avionics or satellite system, CBSAS's modular and consolidated approach to manifest either an avionics or satellite system is capable of combining previously un-combinable disciplines such as Comm and Power into one unit, therefore allows the essence of this invention to exist for the first time ever in aerospace or any other industry.

20) The avionics manifestation of CBSAS can equally function within the benign atmosphere or aboard a satellite in space without any modification, in sharp contrast to existing black-box avionics systems comprised of individual boxes, where each box is either space rated or atmosphere rated, and if space rated, by simple fact of that designation will cost orders of magnitude more than a box solely used within the atmosphere, but not so with CBSAS.

21) Costly space qualification tests are slashed by CBSAS due to only needing to test one consolidated unit that would normally be comprised of approximately 5 individual units with a federated standard black-box system, which would require the corresponding number of space qualification tests, with one qualification test being required for each box, vs. CBSAS where only testing one consolidated box containing all five previously segregated functions is necessary.

22) The integration of previously segregated EMI/RFI enclosures into a single stacked unit with an internal raceway with its own separate EMI/RFI chamber adjacent to the enclosures contained within a module is unprecedented, and is what allows the miniaturization of an avionics suite or a complete satellite system to be manifested into the single stacked unit known as CBSAS 23) Assembly of CBSAS into a solid single structure is unprecedented amongst all the other federated black-box avionics and satellite systems whereby the vehicle attach points of the various black-boxes require full individual integration and cabling to each separate box, in sharp contrast to CBSAS which utilizes a unique interlocking tongue and groove system to secure each module to each other, resulting in an integrated Structure with internal cabling that withstands any severe environment encountered within or outside of the atmosphere 24) In order for CBSAS to be usable as a standalone satellite in addition to an avionics system, it was important to remove all outer cabling from the modules structure and run the cables internally as the invention shows, which additionally provides the most stable structure possible when it comes to passing space qualification testing, especially since an external cable system would subject the unit to immediate EMI hazards when deployed in space, rendering it useless.

25) CBSAS levels the playing field for applications on small satellite launching systems up through large and expensive satellite launching systems without requiring any modification, and when coupled with the sustainability and repeatability of manufacture, large numbers of units can be quickly manufactured, keeping the price point lower than any federated avionics system.

26) The military robustness rating of CBSAS allows for the armed forces to quickly proliferate space with the inexpensive bus structures of this invention for all types of satellite applications in a rapid deployment fashion, and while keeping increased numbers ready in orbit, and their tiny size makes them much more survivable than a larger satellite with an equivalent mission.

CONCLUSION, RAMIFICATIONS AND SCOPE

Given all the above detailed description of this first bus usable for atmospheric avionics, avionics on satellites in space, and as a stand-alone satellite, it also removes the cost barrier whereby a system utilized in the harsh conditions of space is also cost effective for use on vehicles operating within the atmosphere. Previously it would have also been cost prohibitive and impractical to adapt any avionics utilized in atmospheric conditions for use in a space environment.

For the first time in the aerospace or any industry, the data acquisition, computational and system components and interfaces of a satellite or avionics system are of a nature whereby their associated physical outer structure is integral with the components themselves that comprise it within a single assembled box system, thereby making the whole satellite or avionics system an integrated and consolidated structure. In sharp contrast to this approach, all other existing avionics and satellite systems employ a physical outer enveloping structure that houses many black boxes connected with external cabling in a federated manner to comprise the satellite or avionics suite in a distributed, non-integrated way.

The integrated and consolidated approach of this invention creates an opportunity in the aerospace or any industry to forge a new dimension and paradigm when it comes to the assemblage of components which comprise a satellite or avionics system which can function equally as well on vehicles operating within benign atmospheric conditions either terrestrially or not, up through and including the harsh environment of space.

Of further note, accompanying this invention is the unprecedented ease of incremental or full upgrades of internal components which paves the way for extreme employment and modification cost reductions on a global scale, with no other federated system even coming close to the capabilities made instantly possible with this invention.

Finally, CBSAS allows for the ease of deployment of hundreds of nano/micro satellites to form constellations in Space with different payload instruments that communicate at high speed rates between each other to form a disaggregation architecture which emulates a large satellite and/or make hundreds of scientific measurements simultaneously to gain additional scientific insight and knowledge.

Additionally, the following expansion on the above is of notable importance:

- It has unprecedented flexibility from design, buildup, test and operations due to its simplistic open architecture that allows it to function as a satellite or an avionics system for use within the atmosphere or in space without any internal modification, while additionally allowing for the most fail-safe operations possible via the lightweight internal components which can have backup systems resident within the modules.
- It employs the same open architecture within a satellite or avionics configuration, allowing for unprecedented and highly repeatable assembly and testing to occur prior to flight to maximize its reliability, and if an anomaly occurs, rapid replacement of module components or the module itself can occur, in addition to fail-over and fault tolerant software being present that can reconfigure the flight unit if deployed and inaccessible to human intervention.
- It is equally possible to have a satellite or avionics configuration function during all mission phases as a completely self-contained system that provides a data downlink for monitoring all systems within the consolidated stack of modules.
- It has a crossover nature with standard protocols enabling it to interface with any sensors in a common way that has direct applicability for a satellite or avionics implementation, while also enabling a simplistic approach for integration into any vehicle when manifested as an avionics suite for use within the atmosphere or in space.
- It is possible to reconfigure CBSAS quickly and efficiently on a module level, on down to a component level within the modules in a manner that allows for a rapid response capability to maintain a timeline, whether during a production, testing or flight phase.
- It has an unparalleled capability for instantaneous upgrades whether in an avionics or satellite configuration, therefore allowing for the latest component technologies to be integrated as soon as they are available, and thereby minimizing risks when adopting and integrating these new technologies.
- It has the smallest footprint, weight and power requirements of any stand-alone satellite or avionics suite of similar capability, while additionally possessing complete crossover architecture for the first time between the avionics and satellite disciplines.
- It can be reconfigured in a very rapid manner in the event that mission objectives change which require new internal components, or even the addition of new modules to be added to the stack.
- It provides for the most responsive implementation of satellite vs. avionics buildup whether in the early manufacturing stages, or later on during final assembly with test and check-out, while simultaneously even allowing for a last minute change of the unit being manifested as a satellite or an avionics package.
- It is employable on any size vehicle currently utilizing avionics comprised of many federated black-boxes, while subsequently requiring a fraction of a footprint, power and allowing those metrics to be utilized by other disciplines for housing new capabilities which can generate additional revenue which would otherwise not have been possible.
- It has an on-board ability for monitoring or being controlled via full duplex communications, giving a real-time connection with all systems whether functioning as a consolidated avionics suite or as a stand-alone satellite.
- It employs a design philosophy whereby multiple pathways to mission success are assured, from having backup systems aboard to the uplink of new instructions to perform self reconfiguration, even while a mission is underway when functioning either as a satellite or as an avionics suite.
- It employs a programmed internal test and checkout sequence to evaluate the health of all components, and re-tests all systems upon the issuance of a reconfiguration command, whether the system is manifested as a satellite or an avionics suite.
- It has unparalleled reliability whether functioning as a satellite or as an avionics suite due to the failure analysis intricately performed in software which governs the processing part of the system in either application.
- It emulates the functions of a federated black-box system without requiring the rigorous multi-box qualification testing necessary with all other avionics or satellite systems, while additionally being internally upgradeable without causing a full re-qualification testing on an individual single box basis.
- It minimizes the complexities normally involved with the upgrade and interface testing of a federated black-box system, even if the upgrades and changes are relatively minor but could still cause unpredicted anomalies to occur.

It greatly simplifies the cabling and accelerates the installation time required to install an avionics system on any aerospace platform, while simultaneously reducing size, weight and power, by not only by having a single consolidated box with all connections being completed internally, but also realizes the benefit of not having many pounds of external wire harnesses connecting numerous black-boxes.

It has an active internal cross-talk capability between all modules which also streams the health and status state of all systems to a monitoring station via telemetry which can travel via UHF, SHF and EHF communication simultaneously with a backup stream traveling via a worldwide consumer satellite network to any location.

It is the first single integrated common avionics or satellite bus to integrate RF, power, processing, communications and other singular functions into a single box, therefore making it possible to employ that box as the first to be instantly usable as a satellite or an avionics system employed within the atmosphere or aboard a large satellite in space.

It is quickly deployable within the rigid guidelines required for critical responsive space missions, while assuring it is as robust as any military satellite or avionics system in any scenario within atmospheric conditions, or if deployed in the harsh environment of space.

It decisively shortens the timeframe required for pre-deployment systems qualification testing by only requiring one box to undergo this testing, vs. existing federated black-box systems typically requiring approximately five individual boxes to undergo this testing, which in-turn sharply decreases the associated cost of employing CBSAS as an avionics suite or a satellite system, as systems qualification testing is very expensive and requires up-front long term scheduling.

It is the first single structure of its kind that incorporates all aspects of avionics or equally a satellite bus into one distinct box that is universally adaptable for use in any aerospace vehicle under any environmental condition.

It employs a design method to negate the effects of shock and vibration while simultaneously maintaining an assemblage of interlocking faraday cages that seamlessly pass data between each other in any order and subsequently transmit all required data to a receiving station.

It is the only aerospace structure in existence that integrates a multitude of previously unmixable disciplines such as RF and Power into a single structure without external cabling between what used to be these external RF and Power black-boxes, with only a single cable being required to externally interface with CBSAS for charging its internal batteries and for bi-directional health/status communication between CBSAS and an external monitoring system.

It achieves the most important goal of a responsive space system, that of being quickly fielded in the shortest timeframe possible by employing a standardized assembly line type of buildup operation due to the elegant simplicity of all the repeatable components which make up the system, whether for ultimate use as a satellite or as an avionics system.

It is the first system that can be used as a stand-alone satellite, an avionics package within a larger satellite, or as an avionics package onboard a vehicle within the atmosphere, thus employing a standardized approach and interface that is unprecedented in the aerospace field.

The many detailed descriptions above must not be interpreted in any manner to indicate a limit to the scope of this invention, as its only intent is to provide examples of its functionality obtained by employing it in many possible configurations. For example, the CBSAS may contain any number of partitioned internal RFI/EMI chambers and raceways than the three illustrated in FIG. 3. Although many specifics have been contained therein to help describe the functioning of this system in a simple modular way, they should not be construed to confuse the main aspect of this invention being the first time an avionics bus system and a satellite system share a common core bus structure, and that common core bus is instantly usable as an avionics system within the atmosphere or outside of it aboard a larger satellite, and additionally can serve as a stand-alone satellite itself employed in space. In order to make this instantly transformable capability possible, CBSAS is designed, manufactured and tested by incorporating the aspects of complete scalability, modularity, open architecture, flexibility, stackability, interconnectivity, reconfigurability, adaptability, interchangeability and consolidation in a single unit system which takes the place of many black-boxes boxes comprising all previously existing avionics, satellite or other types of technology systems functioning terrestrially or up though and into the environment of space.

Additionally, for the first time in the history of the aerospace industry, no longer will there be a reliance upon the distributed, inefficient and unique black-box systems which very inefficiently proliferate the avionics and satellite industries to provide the functions of TSPI, DA/P/R, PG/D, wireless communication, avionics, navigation, command and data handling, which are certainly not adaptable into becoming a stand-alone deployed satellite or consolidated avionics system, and certainly not of a common design and structure to be equally and instantly utilized as either a stand alone satellite or avionics system within or outside of the atmosphere. Additionally, all multiple black-box avionics systems and satellites always have their internal components housed in a uniquely fabricated box assembly structures, opposed to the essence of this invention being that of a mass-producible and repeatable common structure that can be instantly utilized as either a stand-alone satellite or an avionics system employed within or outside of the atmosphere without any modification. Therefore with CBSAS, the single integrated and consolidated inner and outer structure together comprise the totality of the complete system, including the capability to provide RFI/EMI shielding on a modular or sub-modular level, as well as an integrated box system level, while easily passing all required environmental full-scale qualification testing, including shock, vibration, thermal and the like. Thus, the scope of this invention should only be determined by the appended claims and their legal equivalents.

I claim:

1. A Chambered container capable of functioning as a single integrated system for avionics and as a single integrated stand-alone satellite comprising:

An open top stackable module having an open upper end, a module floor, a front wall, a rear wall and sidewalls between said front wall and said rear wall, said module floor being perpendicular to said front wall, said rear wall and said sidewalls; said module floor having an interior floor and a module floor underside, said module floor underside having mounting means engageable with said open upper end of a second said open top stackable module for removably receiving and securing said module floor underside to said open upper end of second said open top stackable module positioned below to form a sealed module; said open top stackable modules capable of repeating this stacking procedure with additional said open top stackable modules; said open upper end of upper-most said open top stackable module being engageable with a module lid having a mounting means for removably receiving and securing said open upper end of uppermost said open top stackable module to said module lid; said module floor underside of bottom-most said open top stackable module being engageable with a module stack base for removably receiving and securing said open top stackable module to said module stack base;

said open top stackable modules having a compression means to secure said stacked modules together with said module lid and said module stack base;

said open top stackable module being internally partitionable into sub chambers;

said open top stackable module simultaneously containing at least one partitioned section without said module floor to collectively form a raceway sealed module chamber volume that is perpendicular to all said module floors traversing all stacked said open top stackable modules between said module lid and said module stack base; said raceway sealed module chamber volume being engageable with an internal connector raceway means for removably interconnecting an array of electronic components within said open top stackable modules to physically and EMI/RFI isolate all said stackable modules from each other:

said chambered container having an access interface means for connecting a power and a charging and a monitoring interface means to said chambered container to access said array of electronic components and an energy storage means aboard said chambered container within said open top stackable modules.

2. A chambered container as claimed in claim 1 wherein said module lid is engageable with a solar collecting means.

3. A chambered container as claimed in claim 2 wherein said module lid is engageable with an antennae means.

4. A chambered container as claimed in claim 3 wherein said module stack base and bottom-most said module is appended for housing a thrusting propulsion system means.

5. A chambered container as claimed in claim 4 wherein any desired said stacked module is adapted with an attitude control means for orienting said chambered container in 3 axis.

6. A chambered container as claimed in claim 5 wherein said chambered container is deployed as a stand-alone satellite in space.

7. A chambered container as claimed in claim 1 wherein said modules, said module lid and said module stack base are comprised of a metallic substance.

8. A chambered container as claimed in claim 7 wherein said module lid is engageable with a solar collecting means.

9. A chambered container as claimed in claim 8 wherein said module lid is engageable with an antennae means.

10. A chambered container as claimed in claim 9 wherein said module stack base and bottom-most said module is appended for housing a thrusting propulsion system means.

11. A chambered container as claimed in claim 10 wherein any desired said stacked module is adapted with an attitude control means for orienting said chambered container in 3 axis.

12. A chambered container as claimed in claim 11 wherein said chambered container is deployed as a stand-alone satellite in space.

13. A chambered container as claimed in claim 1 wherein said chambered container is deployed as a stand-alone avionics unit on an aircraft, a UAV, a missile, a rocket, a satellite and any additional platforms where an avionics capability is desired.

14. A chambered container as claimed in claim 7 wherein said chambered container is deployed as a stand-alone avionics unit on an aircraft, a UAV a missile, a rocket, a satellite and any additional platforms whereby an avionics capability is desired.

* * * * *